(12) United States Patent
Tieri, Jr.

(10) Patent No.: US 8,409,314 B2
(45) Date of Patent: Apr. 2, 2013

(54) PSA FILTER

(76) Inventor: Donald John Tieri, Jr., Medinah, IL (US)

( * ) Notice: Subject to any disclaimer, the term of this patent is extended or adjusted under 35 U.S.C. 154(b) by 252 days.

(21) Appl. No.: 13/021,650

(22) Filed: Feb. 4, 2011

(65) Prior Publication Data

US 2011/0192285 A1 Aug. 11, 2011

Related U.S. Application Data

(60) Provisional application No. 61/303,120, filed on Feb. 10, 2010.

(51) Int. Cl.
*B01D 46/10* (2006.01)
*C09J 7/00* (2006.01)

(52) U.S. Cl. ....... 55/385.6; 428/343; 428/41.8; 361/801

(58) Field of Classification Search ............... 55/385.6, 55/490; 73/864.71; 428/343, 40.1, 41.7, 428/41.8; 361/801
See application file for complete search history.

(56) References Cited

U.S. PATENT DOCUMENTS

| | | | | |
|---|---|---|---|---|
| 4,709,503 A | * | 12/1987 | McQueen | 43/114 |
| 5,223,006 A | * | 6/1993 | Moran, III | 96/18 |
| 5,676,718 A | * | 10/1997 | Davison et al. | 55/385.6 |
| 5,693,895 A | * | 12/1997 | Baxter | 73/863.22 |
| 5,811,184 A | * | 9/1998 | Anderson et al. | 428/343 |
| 5,902,678 A | * | 5/1999 | Konda et al. | 428/345 |
| 6,767,379 B2 | * | 7/2004 | Jones | 55/385.6 |
| 6,827,373 B2 | * | 12/2004 | Zumberge | 283/81 |
| 2006/0046534 A1 | * | 3/2006 | Birmingham | 439/76.1 |

FOREIGN PATENT DOCUMENTS

GB 2210543 A * 6/1989
WO WO 2005/110294 A1 * 11/2005

* cited by examiner

*Primary Examiner* — Frank Lawrence, Jr.

(57) ABSTRACT

The PSA Filter is a non-electronic air filter utilized in the interior or exterior of any device which uses air movement as a means of ventilation or circulation including, but not limited to a computer, printer or any other type of electronic or non-electronic devices. This invention consists of a base substrate which is covered with a PSA (pressure sensitive adhesive); such that the PSA material applied to the substrate is the active filtering element, this PSA coated substrate is inserted into or on a device for the purpose of trapping dirt, dust, pollen, fibers, and any additional types of air borne contaminants, that may inadvertently enter from the outside environment through factory installed vents, or that may be created inside of the device from its normal operations, thus said contaminants become trapped onto the PSA filter surface through air-circulation.

9 Claims, 3 Drawing Sheets

Donald J Tieri Jr.
PSA Filter
Figure #1
Donald J Tieri Jr.
PSA Filter
Figure #1a
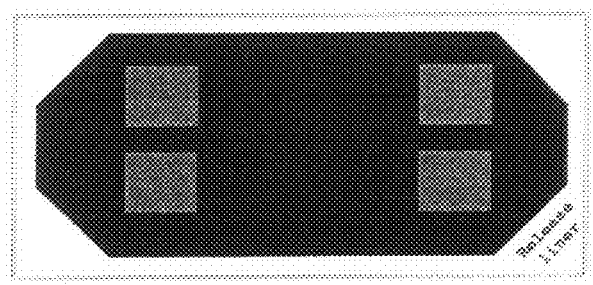
Donald J Tieri Jr.
PSA Filter
Figure #1b
Donald J Tieri Jr.
PSA Filter
Figure #1c

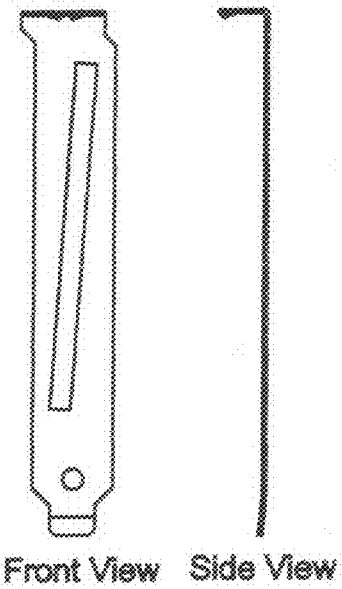
Donald J Tieri Jr.
PSA Filter
Figure #2
Front View   Side View
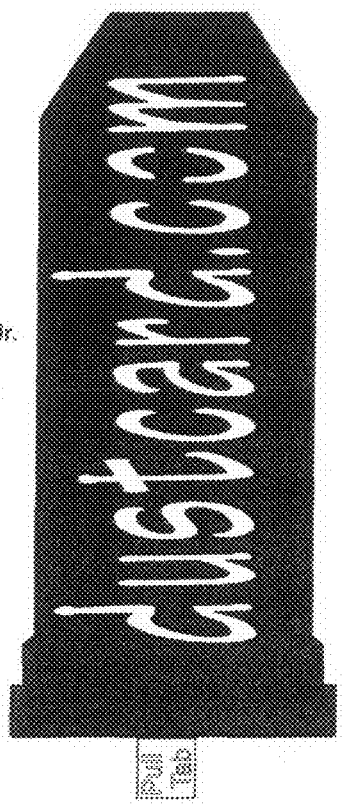
Donald J Tieri Jr.
PSA Filter
Figure #2a
Donald J Tieri Jr.
PSA Filter
Figure #2b

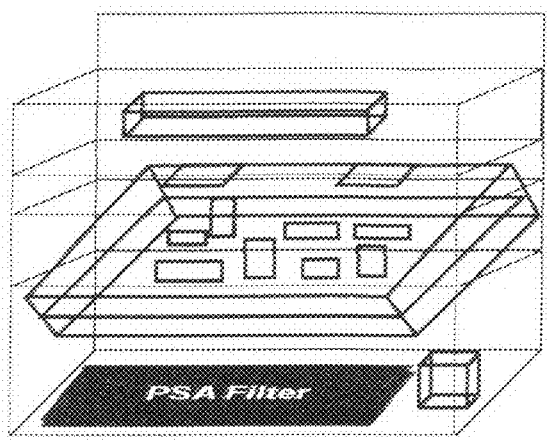
Donald J Tieri Jr.
PSA Filter
Figure#3
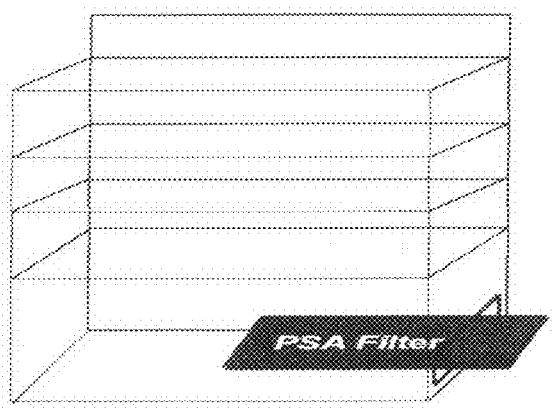
Donald J Tieri Jr.
PSA Filter
Figure#3a
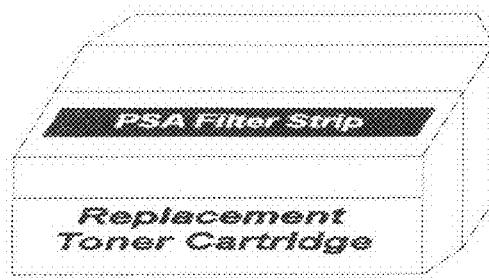
Donald J Tieri Jr.
PSA Filter
Figure#3b

PSA FILTER

BACKGROUND OF INVENTION

1. Field of Invention

The present invention relates to a non-electronic air cleaner composed of a PSA (Pressure Sensitive Adhesive) Filter to trap any foreign air borne or operational contaminants or debris that may invade the interior or exterior of either an electronic or non-electronic devices by means of air circulation, vacuum, gravity, natural temperature convection or even the rotary effects of the internal machinery.

2. Description of the Prior Art

All electronic devices are manufactured within some type of "clean room" it is the hope of all manufacturers that these electronic devices maintain this type of clean environment so that their devices will continue to perform to their optimum design specifications. However these devices come under attack by environmental contaminants the very minute they are taken out of their original packaging.

It is well known and undisputed that both air born contaminants and operational contaminants greatly reduce the life cycle of all electronic and non-electronic devices. This build up of dirt, dust, fibers, paper and other contaminants reduces air flow and impedes proper operation of both internal moving and electronic parts, causing said parts to overheat and or by reducing tolerances in the moving parts causing them to jam, stick, miss-feed and fail prematurely. These device failures cost both businesses and private owners alike, to lose millions of dollars each year when they attempt to recover or duplicate lost work. Ultimately if left unattended all devices will overheat or wear out and fail prematurely due to contamination. It has been the hope of many prior arts to maintain this "clean room" environment inside devices. Although there have been numerous innovated prior art attempts, U.S. Pat. No. 5,233,006 to Mr. Moran and U.S. Pat. No. 5,676,718 to the Davison's and many others, all without exception exhibit the same design disadvantage, that being when you attempt to place any type of air filter between the incoming air flow and a device, this will always result in the same problem, that being, if the filter material is not maintained with extreme diligence it will eventually clog because of these contaminants and block the factory designed air cooling circulation.

These prior arts also exhibit an extremely limited use by being designed to fit only a certain type and size of devices. Finally these prior arts make no attempt to eliminate internal contaminations, paper scrapes, toner dust, steel or plastic particles that are created by the device itself as it performs its normal or at times, abnormal operations.

Respectively, as in prior art U.S. Pat. No. 5,223,006 this air cleaner box will perform as described however it lacks in 5 very important areas that are corrected by the use of the PSA Filter.
1) Without the proper filter maintenance any device inside the box will fail due to the exterior filter becoming blocked resulting in a lack of cooling air flow inside the box.
2) The box is much larger then a small single piece of equipment, the box takes up a large amount of space and impedes normal direct access to any device placed inside.
3) In no fashion does this prior art attempt to or by virtue of its design eliminate any of the internal contaminants that are created by the device itself while it is performing its normal duties and operations.
4) The air cleaner box must utilize electricity to power the additional exterior fans.
5) This filter substrate is not recyclable Like wise and respectively, prior art U.S. Pat. No. 5,676,718 drive bay cover filter, will perform as described, however lacks its own set of 5 very important features that once again are corrected by the use of the PSA Filter.
1) Without the proper filter maintenance the bay cover filter on the computer will fail due to the exterior filter becoming blocked resulting in a lack of cooling air flow.
2) Cover filter is completely proprietary and must be redesigned, remanufactured for each different computer that will use it, the cover is no way universal by today's newer computer design standards
3) In no fashion does this prior art attempt to or by virtue of its design eliminate any of the internal contaminants that are created by the device itself while it is performing its normal duties and operations.
4) No attempt is made to filter any of the other air vent openings on the computer
5) This filter substrate is not recyclable

BRIEF SUMMARY OF THE INVENTION

In light of these fore-mentioned prior arts missing elements, this new art obtains the desired end point of all other prior arts in this field without any of their short comings, inherit universal limitations or ecological disadvantages.

There are four main methods by which a PSA Filter can be placed inside or outside of any type device.
1) Universal or retro-fitted, one of the most unique attributes about this new art is that because of its simplicity of design this product can be modified in regards to size and placement by any person. The PSA Filters substrate can be easily modified with a simple pair of scissors to fit into any needed space either inside or outside of any type device. Simply attach the provided double-sided adhesive foam stand-offs any where on the Substrate and then attach the PSA Filter anywhere as needed in or on the device.
2) Statically placed in the interior by the manufacturers of the device to only be changed by a trained professional; or when making a toner, print cartridge or maintenance kit upgrade or replacement.
3) Through a factory modified PCI bracket installed by the manufacturer or an aftermarket installation by the device owner, allowing the PSA Filter Card to be changed by any person when needed because of complete particle contamination.
4) Through a factory install slot placed anywhere on the device that the manufacturer deems necessary for maximum air and contamination filtering allowing the customer to change the PSA Filter when contaminated or as part of a maintenance/replacement kit.

The highly adhesive wet surface of the PSA Filter forms a viscoelastic bond that is termed "aggressive" and remains permanently tacky, and will attract and hold most air borne and operational contaminants before they can settle on any of the interior components, thus reducing the build up of all these contaminates which overtime can result in electrical parts overheating and or, reduction in the tolerances in moving parts causing them to jam, stick, miss-feed wear out and fail. Not only does this invention reduce the level of external contaminants inside a device it also prevents operational contaminants from escaping into the environment surrounding the device. The PSA Filters make intelligent green use of the devices own internal air currents that are generated by fans, air circulation, vacuum, gravity, temperature convection or even the rotary effects of the internal machinery itself, without blocking any of the valuable factory air flow.

What is new, and is proved is that the new PSA Filter:
1) Does not require any additional fans or electricity. Because it intelligently makes use of all types of existing air movement.
2) is safe for the environment because the PSA Filter substrate base is made of a recyclable material which is covered with a disposable FDA approved Pressure Sensitive Adhesive.
3) By its very nature the PSA's wet surface will attract and thus filter and remove all air born and operational contaminants that come in contact with its aggressive, permanently tacky surface by way of entering in from the outside of the device and also eliminate internal contaminations that are created by the device itself as it performs its normal or abnormal, wear and tear operations.
4) Does not release these trapped external and internal contaminants back into either the device or the environment because they become permanently embedded onto the highly adhesive PSA surface.
5) By simply removing and replacing with a new PSA Filter when contaminated, completely renews the performance for trapping external air contaminants and filtering internal operational contaminants from harming the device or escaping out into the environment.
6) Does not harm the device because of failure on the customer's part to replace a PSA Filter when needed and cannot adversely hurt the electronic device by reducing or blocking necessary air flow to the internal components. By failing to maintain or replace the Filter worst case scenario is that the Filter no longer will attract and trap additional contaminants.
7) Makes use of the PSA material applied to the substrate as the filtering element for this invention and that the substrates main purpose is to physically support the PSA material.

BRIEF DESCRIPTION OF THE DRAWINGS

The following drawings are to aid in the understanding of not only the specific parts of this invention but also show some of the many ways the PSA Filter can be installed either in the interior or exterior of any brand of computer, printer, fax, server, cable/satellite box, electronic and or, non-electronic devices alike.

FIGS. #1, 1a, 1b, 1c, by nature of simplicity this invention consists to only two main parts FIGS. 1, 1a) that can be easily retro-fitted into any space. The PSA Filter substrate in this example is made out of a hard cardboard mat which is factory covered with a (PSA) pressure sensitive adhesive which is FDA approved for safety. In this version the perforations in the PSA Filter substrate allows some unfiltered air to pass through the openings in the substrate so as to not impede factory air flow inside of the computer, printer or device.

FIG. (1): example of one type of perforated PSA Filter substrate base where in the perforations are in the shape of a products name cut into and through the base substrate with the factory applied PSA coating pre-applied to the outside of the substrate which then is covered with a release liner(s) to aid in handling and protect the PSA from debris before use.

FIG. (1a): example of one type of double-sided adhesive foam stand-offs which can be used if needed for attachment of substrate to the interior or exterior surface of any device.

FIG. (1b): example of a non-perforated PSA Filter for a variety of uses that do not require perforations for needed air flow, with placement of double-sided adhesive foam stand-offs.

FIG. (1c): example of how multiple perforated PSA Filters can be stacked on top of each other to form an offset series of perforations where in the perforations are in the shape of a product name cut into and through the base substrate which would still allow air flow, however would guarantee that all air would come in contact with the PSA adhesive surface before passing through the series of Filters. Each individual PSA Filter is separated by double-sided adhesive foam stand-offs FIG. #2, 2a, 2b displays the factory modified PCI bracket and PSA Filter Card along with a drawing showing how (2a) looks when properly inserted into (2).

FIG. (2) example of a front and side view of the modified PCI bracket that fits in place of any standard available PCI bracket slot inside your computer, printer or device.

FIG. (2a) example of PSA Filter Card where in the perforations are in the shape of a product name cut into and through the base substrate, either a perforated, or non-perforated PSA Filter Card can be used in this application both fitted with a easy removal tab that remains outside of the factory modified PCI bracket facilitating easy removal and replacement of the PSA Filter Card.

FIG. (2b): example of how the PSA Filter Card would appear when placed through the optionally available, factory modified PCI bracket.

FIG. #3 example of how a manufacturer could place a PSA Filter deep inside of a device that would only be serviceable by a trained professional, because of multiple layers of obstacles or electrical hazards that would impede normal customer access.

FIG. #3a, 3b displays how a manufacturer of a device that does not contain a PCI bracket slot option to be modified during or after production of their existing device cover or framework through the placement of a slot or opening to be used by the PSA Filter.

FIG. (3a): example of the insertion of a PSA Filter Card such as used and shown in FIG. (2a) this factory formed slot or opening in the device's cover or framework can be placed anywhere as long as the insertion of the PSA Filter Card does not interfere with any of the internal components. The use of this slot would be very similar in nature to the operation as presented in FIG. #2b without actually using the modified PCI bracket.

FIG. (3b): example of how the use of a PSA Filter Strip, could be used on replaceable components of a device like a toner replacement cartridge or like device, which would add the benefit of a new PSA Filter Strip each time a cartridge or like device was replaced by the customer and or any service person. The purpose of which is to catch and trap operational contaminants like toner dust.

Please be advised that these examples are only a small fraction of the actual uses of this invention, there are numerous substrate materials that could be used and an ever increasing amount of various PSAs that can be applied to those substrates, and in regards to size and shape or geometric design; these substrates can only be limited by the amount of devices that may be conceived now and in the future. Any variations and or modifications to this invention are in no way a departure from its original scope and use. Also any changes to adapt this invention to any of a variety of machines would still fall under the main scope of this invention; a PSA Filter such that, the PSA material applied to the substrate is the filtering element of this invention.

DETAILED DESCRIPTION OF THE PREFERRED EMBODIMENTS AND USE

Computers, printers, servers, and all electronic and even some non-electronic devices make use of air circulation, these air currents are created by things such as cooling fans and to a lesser effect vacuum, gravity, temperature convection or even the rotary effects of internal machinery, these air currents pull in cool air from the exterior of the device into the interior of the device to help lower the devices overall ambient temperature.

This cool air is needed to cool down the internal components but as this cool air enters the device along comes dirt, dust, fibers, pollen, and other air borne contaminants. This build up of contaminants reduces air flow and impedes proper operation of both the electronic and internal moving parts causing electrical parts to overheat because of the blanketing effect of these contaminates and or by reducing tolerances in moving parts causing them to jam, stick, miss-feed and fail. Additionally many devices create their own internal contaminations (toner dust and or paper fragments) as they perform both normal and abnormal operations. These contaminations reduce both the devices and also through cross contamination neighboring device's life cycle.

One embodiment of this invention is to reduce the build up of these air borne contaminants by placing the PSA Filter in the path of these contaminated internal air currents the filtering effect comes from the contaminants flowing into or falling onto the surface of the PSA material itself, thus becoming adhered to the PSAs aggressive and permanently tacky surface. The PSA applied to any substrate provides a more suitable home for these contaminants based on the fact that the PSA wet surface has a higher adhesion and attraction factor then the smooth metal surfaces which make up the inside of all computers, printers and electronic and non-electronic devices alike.

Another unique embodiment of the PSA Filter is that unlike a conventional air filters that are constructed of fibrous material, which could easily release contaminants back into the environment by simply bumping against a hard surface. The PSA Filter in comparison permanently locks all contaminates to its adhesive surface, which means there is no chance of releasing contaminants back into the device or the environment when the PSA Filter is removed from the device for disposal. Guaranteeing that any dust, pollen or harmful carcinogens do no escape back into the air where they may cause harm to humans, animals or devices.

Also, the PSA Filter has the advantage of only needing to be replaced when necessary; a clean environment will require less frequent PSA Filter replacement then a dirty environment. Resulting in a "Change as you need too" product. That is highly adaptable to all types of rapidly changing environmental conditions.

The PSA Filter strictly adheres to the design criteria for use as a green product, it consumes zero electricity, is 100% recyclable and removes dirt, dust, pollen, fibers and all other types of air borne contaminants not only from the inside of any device but also aids in filtering the air surrounding the device. Once trapped these contaminants cannot be released back into the environment, also contaminants produced by the device itself like toner dust are retained inside of the device, not allowing it to escape into the surrounding atmosphere, thus minimizing the release of potentially harmful air pollutants.

The universal latitude of this simplistic invention is astounding it can be used in any type of electronic and even non-electronic devices made by any manufacturer, anyplace in the world now or at any time in the future. It is extremely versatile in that it can be adapted to fit into any available space either on the inside or outside of a device and still deliver outstanding PSA filtering benefits.

If necessary you also have the option of using multiple PSA Filters either in multiple locations within one device, or by stacking multiple perforated PSA Filters on top of each other to form an offset series of perforations which would still allow air flow, however would guarantee that all air would come in contact with the PSA surface before passing through the Filter area, resulting in improved cleaning and extended filtering performance time.

PSA Sticky Substrates can be scented to emanate natural smells to either relax or invigorate you, and show it is still actively working. The PSA Filter is FDA approved and is safe to use in any location.

Construction: of the PSA Filter substrate as detailed in FIG. (1a): could be made of many different types of base materials, according to the needs of the particular device that requires Filter protection. One of the simplest construction materials to work with is cardboard mat. This material comes in many sizes, colors, thickness, and can easily be cut to form any shape required. The material itself can be made of recycled paper and the end product is recyclable. Also if a perforated PSA Filter is required for improved air flow, matt board can easily be die cut to any sized perforations as needed. In regards to scents matt board holds liquid scents very well and slowly releases these scents over a period of time.

The next element that goes into the construction of the PSA Filter is the (PSA) pressure sensitive adhesive itself. There are numerous types of PSA each one having its own unique set of characteristics, including thickness of film, strength of adhesiveness, and length of time that the adhesive retains its tack in regards to air flow. Which PSA is used is dependent upon which characteristics are needed for any given application, PSA can be applied to both sides of thin Strips of vinyl, and these Strips are than placed on the matt board or directly onto a disposable component of a device such as a toner cartridge, fuser or similar component. Also, the PSA material itself can be applied directly to the mat board or any substrate. Finally the PSA can be applied directly to a physical part that is placed inside or on a device as in a one time use, or a type of disposable device, demonstrating the unique limitlessness and diversity of this invention. Irregardless of how the PSA is applied the final step should be to apply a non-stick quick release liner to one or both sides of the PSA Filter, Card or Strip so that no foreign substances will stick to the PSA until the Filter is ready to be installed or used on a device.

The last remaining basic element of this invention is the double-sided adhesive foam stand-offs shown in detailed in FIG. (1a); this allows the versatility of being able to place the PSA Filter onto any surface. The foams thickness can be varied as needed, the double sided adhesive foam also helps elevate the PSA Filter above the surface to which it is affixed allowing additional air flow to pass along the backside of the Filter, almost effectively doubling the useful adhesive surface area against which the air can flow and deposit contaminates.

Testing has shown that when the PSA Filter was orientated directly in the air-flow this configuration created an area of low pressure turbulence which increases the amount of contamination adhering to the PSA surface on the backside of many given substrates.

The final part of this invention is only needed if the factory modified PCI bracket is the chosen method for inserting a PSA Filter Card inside of a device. This optional modified PCI bracket is constructed out of what is considered a PCI bracket blank. The PCI bracket blank is used to seal the PCI expansion space on the back of a device to reduce undesired airflow into the device. A standard PCI blank is removed and discarded when an add-on graphics card or similar card is placed into the devices motherboard. The modified PCI blank that is used with the PSA Filter Card is shown in detail in FIG. (2). This modified PCI bracket is made of a metal or plastic compound that has a vertical slot cut into it, the slot which is slightly larger then the actual dimensions of the rigid PSA Filter Card itself detailed in FIG. (2a), and will accommodate, orientate and position the PSA Filter Card inside the device in such a way as to maximize the PSA Filter Cards effectiveness detailed in FIG. (2b). The use of the modified PCI bracket facilitates the ease of replacement of the PSA Filter Card when necessary and this is also what is new, will be claimed and requires protection.

Installation: or placements of the PSA Filter. Anyone that has ever looked inside a device such as a computer or printer has seen the effects of time on these devices, the build up of dust, dirt, fibers and paper fragments to a point where the entire inside is blanketed with debris. The placement of the PSA Filter inside of such a device is two-fold. First by placing the PSA Filter ANYWHERE inside of the device that does not interfere with air flow or the devices operation, including moving parts or too closed to high heat elements, will effectively work, the PSA applied to any substrate provides a more suitable home for these contaminants based on the fact that the PSAs wet surface has a higher adhesion and attraction factor then the smooth metal surfaces which make up the inside of all electronic and non-electronic devices alike.

There is no wrong place for the PSA Filter to be located inside of a device, except as noted above in [030], however there is an exact place to locate the PSA Filter to maximize the effectiveness of this product for each individual device. Once again remember the universal aspects of this invention are infinite and to assume that the exact placement for every device in the world that could ever utilize this product would be exhausting and beyond the scope of any one piece of printed material, each manufacturers design team will have to determine which placement method would best suit their devices needs by air-flow mapping or some like science.

However by design the "more appropriate" then anywhere placement of the PSA Filter inside of a device could be intelligently deduced by following these few simple guidelines.
1. Place on the inside of any device or outside over any vent hole (perforated style filter).
2. Place where it will not come in contact or interfere with any of the devices moving parts.
3. Place where it will not cover-up or touch any high heat elements inside of the device.
4. Place where there is increased air flow, by positioning close to fans and vent holes.
5. Trim with scissors to allow for proper fitment, only use the non-perforated type PSA Filter when airflow is not a major concern, like top, bottom, sides or inside access lids or doors.

Briefly, the difference between the perforated and non-perforated PSA Filters correct use is quite simple and is noted as follows.

The non-perforated PSA Filter has no perforations this is a solid piece of substrate covered with PSA it has a larger sticky surface area because there are no perforations, however this lack of perforations will not allow unfiltered air to flow through the substrate all air must pass around the solid substrate, thus reducing air velocity. This version of the PSA Filter would be best suited at the bottom, top or sides of a device or as a PSA Strip on components to catch and hold all types of air borne and internal contaminations that are produced by a device as it goes about its normal operations, the reason being that many of these particular types of contaminations can reduce the tolerances in moving parts causing them to jam, stick, miss-feed and fail.

The perforated PSA Filter has louvers, openings or perforations cut into the substrate, the purpose of these perforations is to allow a predetermined amount of unfiltered air to pass through the substrate guaranteeing that the substrate can never clog and block total air circulation. Wherever air circulation is vital to a device a perforated PSA Filter will be the desired option. This fore-mentioned use of a perforated PSA Filter also requires some additional clarification. It will be questioned as to how efficient a Filter the perforated PSA Filter is, because of the perforations allowing some air to pass unfiltered. First, air inside a device continually circulates, the column of air passing through the perforations in the initial circulation will be different in the subsequent circulations thus over a short period of time all air inside of the device will come in contact with the PSA Filters surface trapping contaminates of varying sizes, the longer the device runs the more effectively the PSA Filter polishes the air both inside and outside of the device.

Second, multiple perforated PSA Filters can be stacked on top of each other with foam stand-offs separating each Filter from the other forming an offset series of perforations which would still allow air flow, and guarantee that all air would come in contact with the PSA Filters adhesive surface before passing through the series of Filters as detailed in FIG. 1c).

Performance: one of the greatest aspects of this invention and also what is new, and will be claimed and requires protection is the filtering size capacity of the PSA Filter. There are many classifications of air filters standard, high efficiency, HEPA. Each classification makes claim to being able to trap smaller and smaller particles. However no pass through filter can claim to trap all particles not even a HEPA filter. For a conventional air filter to properly filter the air the distance between the fibers that make up the filter must be made smaller and smaller in regards to size of the particles that are trying to be trapped, it is easy to deduce that at some point these fibers will become so close that no air will be allowed to pass through the filter.

Also of note is the fact that the closer these fibers become the more resistance these fibers produce to the air flow. There is an opposite reaction to the volume of air flow vs. filter fiber size, the closer the filter fiber the greater the increase in airflow speed required to transport that same volume of air. This is not the case with the PSA Filter because the filtering effect comes from the fact that all particles that contact the adhesive surface of the PSA becomes trapped upon its surface, all particles regardless of size will be filtered out of the air. In fact the only limitation to particle size filtration would be particles smaller then the molecules of the PSA, basically only sub-atomic particles, which are beyond the scope of this papers explanation. Also, of note is that the PSA Filter is not negatively affected by the speed of air flow, the faster the particles strike the adhesive surface the deeper embedded the particles become, the speed of the airflow effectively improves the filtering capabilities.

Another extremely important aspect of this invention in regards to overall performance is the ever growing concern that nano-sized particles are a far greater safety threat to machine, animal and human health. Science is now finding that this fibrogenic dust which was once easily dismissed has a far greater negative effect then once imagined. These small particles can impair clearances in the lung by accumulation, causing cell inflammation, injury and the production of reactive oxygen species that eventually lead to cell mutations and cancer. Although these finding are well documented in animals the IARC believes strongly enough to classify these particles as possibly carcinogenic to humans (Group2B). Carbon Black a component of toner used in many modern office printers and faxes fall under this warning, and are classified as being possibly carcinogenic to humans and sufficient evidence that carbon black does cause cancer in animals.

However even in light of this type of growing scientific evidence there is no product currently on the market that makes any attempt to reduce or eliminate exposure to these types of carcinogens. Standard type air filters easily allow these nano-sized particles to pass freely into our environment. However all attempts should me made to limit our exposure, it is strongly hoped that the addition of at lease a PSA Filter Strip is attached to all OEM and replacement toner cartridges and will be the first of many utilizations of this invention so that we may vastly reduce human and animal exposure to these and many other possibly deadly carcinogen.

In regards to performance, there are many places that the PSA Sticky Substrate can be used in place of a conventional fiber type air filter and without question deliver superior results. However, there are also many applications where a PSA Filter could be used in combination with standard air filters, especially if the PSA Filter was positioned down stream of the standard air filter yet in the air flow, allowing the standard filter to catch the larger sized contaminants, thus allowing the PSA Filter to take a more active role as an air polisher, removing even the smallest particles from the air that not even a HEPA filter could effectively remove. This type of combination of a standard and PSA Filters would prove to be highly effective in certain types of applications, as in large volume air flows and extreme performance applications, where the use of only a standard fiber filter would prove to be very ineffective in regards to nano-particle removal.

Please find below a few of the many uses of the PSA Filter in regards to just electronic devices, computers, servers, routers, printers, fax machines, DVR, VCR, cable/satellite boxes, video and digital cameras, video game systems, projectors, televisions, sound systems, exercise equipment, washer and dryers, refrigerators, stoves, microwaves, furnaces/vents, vacuums, air cleaners, automobiles, lighting systems, and all types of fans.

What is claimed as being new and required to be protected:

1. A manufactured modified PCI bracket that can be fitted in place of any standard available PCI bracket blank or in any available manufactured slotted opening in the case on any devices that utilize this type of technology, comprising:
   a longitudinal slot cut into and through the bracket; and
   a pressure sensitive adhesive (PSA) filter card placed through the slot to enter the interior of a device for filtering purposes such that contaminants flowing into or falling onto the surface of the PSA material become adhered to its surface;
   wherein the PSA card comprises a base substrate and a PSA material applied to one or more sides of the base substrate;
   wherein said bracket can be installed by the OEM manufacturer or be of aftermarket installation and wherein the bracket or slotted opening allows a user to easily insert or remove the PSA filter card without requiring opening of the exterior case of the device.

2. A PSA Filter according to claim 1 wherein,
   (a) The PSA Filter base substrate is constructed of a material selected from the group consisting of, fabric, paper, cardboard mat, composites, plastics, wood, metal and vinyl, in varying amounts of useful thicknesses and numerous geometric sizes, shapes and designs;
   (b) The (PSA) pressure sensitive adhesive's formula or composition varies depending on the required characteristics needed for each particular application, this formula varies based on thickness needed, bond strengths, aggressiveness, and thermal properties;
   (c) The application of PSA material to the base substrate is performed by being sprayed, brushed, rolled, dipped, poured, or applied to another substrate, as is the standard practice where PSA is applied to both sides of vinyl sheets which are then applied to the final base substrate to form the PSA Filter, regardless of the application method all exposed PSA surfaces must always be covered with a release liner to protect the PSA material from contamination before use.

3. A PSA Filter according to claim 1, wherein, the PSA Filter base substrate with PSA and release liner applied is easily trimmed with standard cutting tools that allow easy adjustments of length, size or shape of PSA Filter.

4. A PSA Filter according to claim 1, wherein, the performance of said PSA Filter is improved by added air circulation resulting from cooling fans, vacuum, gravitational forces, temperature convection or the rotary effects of either external or internal machinery, thus by positioning the PSA Filter in or near any of these circulations, the PSA Filter under these conditions traps and removes more contaminants because of the increased volume of exposure to contaminants in the air circulation.

5. A PSA Filter according to claim 1, wherein, the PSA Filter substrate has any of the four major design configurations listed below:
   (a) Perforated design consisting of a substrate with the addition of holes, slots, vents, louvers or passages that facilitate the passage of a specific amount of unfiltered air through the substrate eliminating the creation of hot spots and always allowing air circulation inside of a device even if the PSA Filter is not promptly replaced when fully contaminated;
   (b) Non-perforated design consisting of a solid piece of substrate with no additional holes, slots, vents, louvers or passages to allow unfiltered air to flow through the PSA base substrate;
   (c) Layered design consisting of multiple layers of substrates separated from each other by use of double-sided adhesive foam tape or stand-offs, then stacked or arranged in a fashion that still allows air flow through the PSA base substrates, however at the same time increasing the overall efficiency of the PSA Filter by effectively increasing the surface contact area and useful time of life;
   (d) Box, tube or chamber design consisting of multiple sections of PSA substrates arranged in a fashion that would force the contaminants to circulate inside of said box, tube or chamber for a predetermined amount of time before exiting to more fully allow contaminant entrapment.

6. A PSA Filter according to claim 1 wherein, the PSA Filter base substrate is designed and produced such that the base substrate is in the form of a Card having at least the following elements: a base substrate that is either solid or perforated, covered with PSA material and release liner(s), including a section of the card with no PSA material applied 1to the surface of this section for easy insertion and removal from the manufactured modified PCI bracket, also said PSA Filter Card is of a size, width and shape which allows the PSA Filter Card to be easily inserted and removed through the manufactured modified PCI bracket that has been attached to any device.

7. A PSA Filter according to claim 1, wherein double-sided adhesive foam tape is used for the purpose of attaching multiple PSA Filter substrates together, with the additional purpose of said foam tape to act as a stand-off to elevate the multiple PSA Filter substrates above each other thus allowing air and contaminants to flow onto the front and backside of the multiple PSA Filter substrates increasing the usable PSA surface area of the Filter.

8. A PSA Filter according to claim 1 wherein, a scent is applied to either the PSA material or PSA substrate in any standard acceptable application method which allows said scent to emanate from a device for the propose of enjoyment and to identify the presence of the PSA Filter, said scent emanation time is adjusted so that a lack of scent indicates a scheduled time for PSA Filter replacement.

9. A PSA Filter according to claim 1, wherein the filtering capacity in regards to particle size is capable of entrapment and removal of nano-sized particles which simply pass through a HEPA type filters, and wherein these nano-sized particles become trapped on the PSA surface and cannot be released back into the atmosphere.

* * * * *